United States Patent [19]

Manabe et al.

[11] Patent Number: 4,911,102
[45] Date of Patent: Mar. 27, 1990

[54] PROCESS OF VAPOR GROWTH OF GALLIUM NITRIDE AND ITS APPARATUS

[75] Inventors: Katsuhide Manabe, Ichinomiya; Nobuo Okazaki, Konan; Isamu Akazaki, Machida; Kazumasa Hiramatsu, Yokkaichi; Hiroshi Amano, Hamamatsu, all of Japan

[73] Assignees: Toyoda Gosei Co., Ltd., Nishikasuga; Nagoya University, Nagoya, both of Japan

[21] Appl. No.: 148,633

[22] Filed: Jan. 26, 1988

[30] Foreign Application Priority Data

| Jan. 31, 1987 | [JP] | Japan | 62-21119 |
| Jan. 31, 1987 | [JP] | Japan | 62-21120 |
| Jan. 31, 1987 | [JP] | Japan | 62-21122 |
| Jan. 31, 1987 | [JP] | Japan | 62-21123 |
| Jan. 31, 1987 | [JP] | Japan | 62-21125 |

[51] Int. Cl.$^4$ ............................................. C23C 16/00
[52] U.S. Cl. .................................. 118/719; 118/715; 118/725; 156/613
[58] Field of Search ..................... 118/715, 719, 725; 156/613

[56] References Cited

U.S. PATENT DOCUMENTS

| 3,306,768 | 2/1967 | Peterson | 427/255.3 |
| 3,517,643 | 6/1970 | Goldstein | 118/715 |
| 4,147,571 | 4/1979 | Stringfellow | 118/725 |
| 4,152,182 | 5/1979 | Rutz . | |
| 4,404,265 | 9/1983 | Manasevit . | |
| 4,533,410 | 8/1985 | Ogura | 118/730 |
| 4,673,799 | 6/1987 | Mahawili | 118/724 |
| 4,689,093 | 8/1987 | Ishihara | 118/723 |
| 4,751,192 | 6/1988 | Hirooka | 437/4 |

FOREIGN PATENT DOCUMENTS

| 2397876 | 3/1979 | France | 156/613 |
| 60-50169 | 3/1985 | Japan | 250/423 R |
| 2123607 | 2/1984 | United Kingdom . | |

OTHER PUBLICATIONS

"Growth of GaN Films Using Trimethylgallium and Hydrazine" from Applied Physics Letters, vol. 48, 1986, pp. 1449"1451.

"Metalorganic Vapor Phase Epitaxial Growth of a High Quality GaN Film Using an AlN Buffer Layer" from Applied Physics Letters, vol. 48, 1986, pp. 353–355.

"Epitaxial Growth of GaN on (1012) Oriented Sapphire in GaCl/NH$_3$/He and GaCl/NH$_3$/H$_2$ Systems" from Crystal Research and Technology, vol. 15, 1980, pp. 143–149.

"GaN Blue Light Emitting Diodes Prepared by Metalorganic Chemical Vapor Deposition" from Journal of Applied Physics, vol. 56, 1984, pp. 2367–2368.

"X-Ray Diffraction Topography and Crystal Characterization of GaN Epitaxial Layers for Light–Emitting Diodes" from Journal of Electrochemical Society, vol. 125, No. 12, 1978, pp. 2076–2078.

*Primary Examiner*—Richard Bueker
*Attorney, Agent, or Firm*—Cushman, Darby & Cushman

[57] ABSTRACT

A process and apparatus, whereby in the process of vapor growth of a gallium nitride group semiconductor ($Al_xGa_{1-x}N$; inclusive of x=0) thin film using an organometallic compound gas, a reactant gas which grows $Al_xGa_{1-x}N$ and a reactant gas containing a doping element are separately introduced near to a susceptor and mixed in the vicinity of a substrate held by the susceptor to grow an I-type $Al_xGa_{1-x}N$ thin film, are disclosed. Also, a process of vapor growth and apparatus having a mixing tube and a process and apparatus for inclining the susceptor relative to the reactant gas flow are disclosed. Moreover, a process and apparatus, whereby the $Al_xGa_{1-x}N$ thin film is subjected to the crystal growth using a plasma of the reactant gas under reduced pressure, under the irradiation of ultraviolet rays or laser beams, are disclosed.

6 Claims, 8 Drawing Sheets

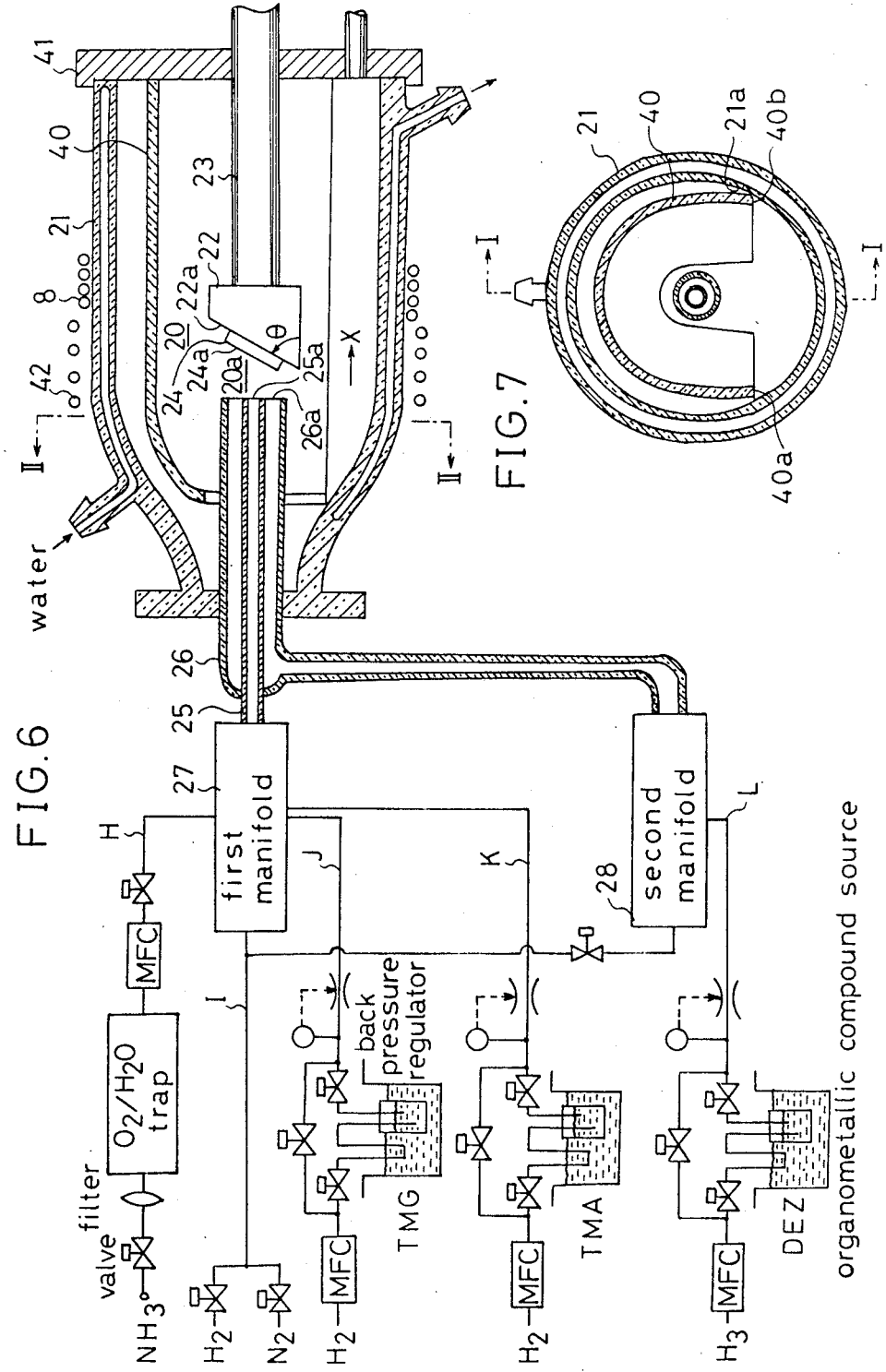

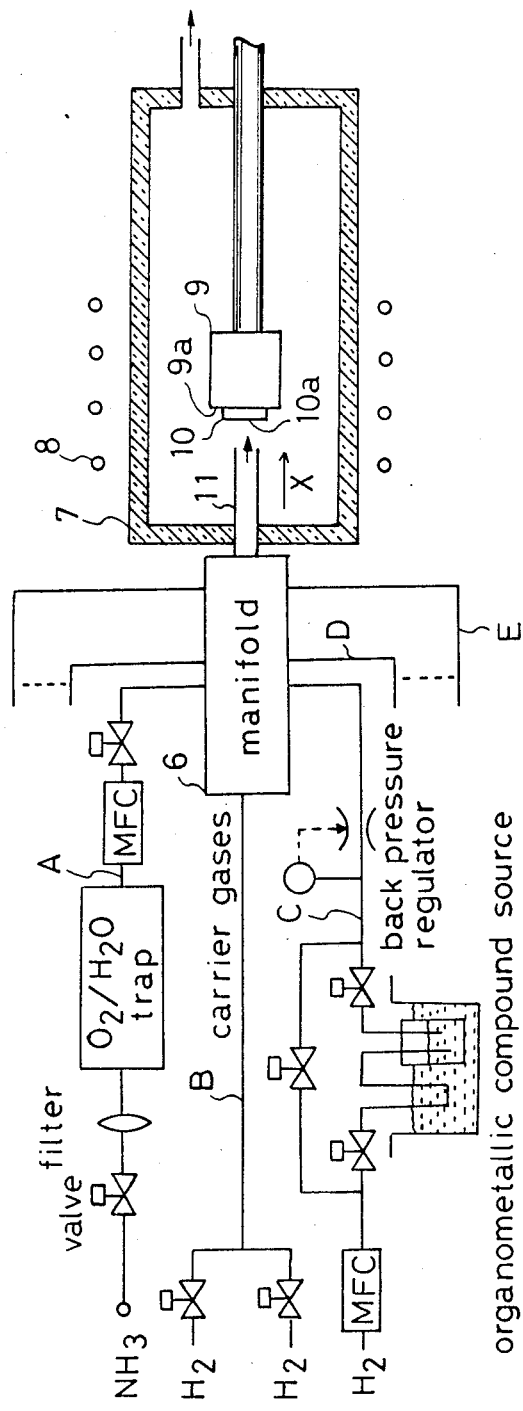

PROCESS OF VAPOR GROWTH OF GALLIUM NITRIDE AND ITS APPARATUS

BACKGROUND OF THE INVENTION

The present invention relates to a process of vapor growth and its vapor apparatus, whereby the crystallinity of a gallium nitride group semiconductor has been improved.

Conventionally, the vapor growth of a gallium nitride group semiconductor ($Al_xGa_{1-x}N$; inclusive of x=0) thin film on a sapphire substrate using the process of metal-organic vapor phase epitaxy (hereinafter referred to as "MOVPE") has been studied.

The MOVPE is conducted by using a vapor growth apparatus as shown in FIG. 11. In the vapor growth apparatus, to a quartz reaction tube 7 a manifold 6 is connected, to which a supply system A of $NH_3$, a supply system B of $H_2$ and $N_2$, a supply system C of trimethylgallium (hereinafter referred to as "TMG") of an organometallic compound gas, a supply system D of trimethylaluinum (hereinafter referred to as "TMA") of the organometallic compound gas and a supply system E of diethylzinc (hereinafter referred to a "DEZ") which is a reactant gas containing a doping element (hereinafter merely referred to as "dopant gas") are connected. Also, in the quartz reaction tube 7, a high frequency heating graphite susceptor 9 is provided, on which a sapphire substrate 10 is disposed, which is heated by a high frequency coil 8. Each reactant gas and carrier gas from each supply system are mixed in the manifold 6, and a mixed gas is led to the quartz reaction tube 7 and blown against tee sapphire substrate 10 to grow the $Al_xGa_{1-x}N$ thin film thereon.

Then, by changing the mixing ratio of each organometallic compound gas, the composition ratio can be changed and the thin film of I-type (Intrinsic) $Al_xGa_{1-x}N$ can be formed by doping zinc.

SUMMARY OF THE INVENTION

In such a prior art apparatus, the dopant gas DEZ and the other reactant gases such as TMG, TMA, etc. are mixed in the manifold 6 before entering the quartz reaction tube 7. However, it has been found through the experiment carried out by the inventors that, since TMG and DEZ are very reactive at the room temperature, if the two gases are mixed in advance at a distance from the sapphire substrate 10, they react quickly, resulting in a poor crystallinity of I-type $Al_xGa_{1-x}N$ grown on the sapphire substrate 10.

That is, the conclusion was that, the highly reactive dopant gas is mixed with the other reactant gases near the sapphire substrate 10 and decomposed during the growth of $Al_xGa_{1-x}N$, so when an element to be doped is doped into the growing $Al_xGa_{1-x}N$, a thin film with high crystallinity can be obtained.

Also, in the prior art apparatus, in order to improve the crystal growth rate, the main surface 9a of the susceptor 9 was disposed at right angles to an axis X which is parallel to a gas feed tube 11, and the reactant gases such as TMG, TMA, $NH_3$, DEZ, etc. were blown at right angles against the main surface 10a of the sapphire substrate 10.

However, we have found that when the $Al_xGa_{1-x}N$ thin film was grown practically, its crystallinity was not so good when blowing the reactant gas at right angles against the sapphire substrate 10, but with the main surface 10a of the sapphire substrate 10 being inclined relative to the direction of gas flow, the better crystallinity was obtained.

Moreover, in the prior art apparatus, since the crystal growth takes place at high temperature of 950° C. to 1050° C., resulted in the poor crystallinity and a carbonaceous soot produced by decompositions of the organometallic compound gases such as TMG, TMA, etc. was taken into the crystal.

The present invention has been made in view of the above conclusion.

It is, therefore, a primary object of the present invention to provide a process of vapor growth and a vapor growth apparatus for obtaining an I-type or N-type $Al_xGa_{1-x}N$ thin film with a high crystallinity.

It is another object of the present invention to provide a process of vapor growth and a vapor growth apparatus for obtaining an $Al_xGa_{1-x}N$ thin film with a high crystallinity by enabling the crystal growth a low temperature.

BRIEF DESCRIPTION OF THE DRAWINGS

FIG. 6 is a structural view showing a vapor apparatus shown in the 4th embodiment.

FIG. 7 is a sectional view taken in the direction of the arrow along the line II—II of FIG. 6 showing the structure of a vapor growth apparatus shown in the 4th embodiment.

FIG. 11 is a structural view showing a prior art vapor growth apparatus.

DESCRIPTION OF THE INVENTION

The present invention will be described in the following referring to the specific embodiments.

1st Embodiment

Figure 1:
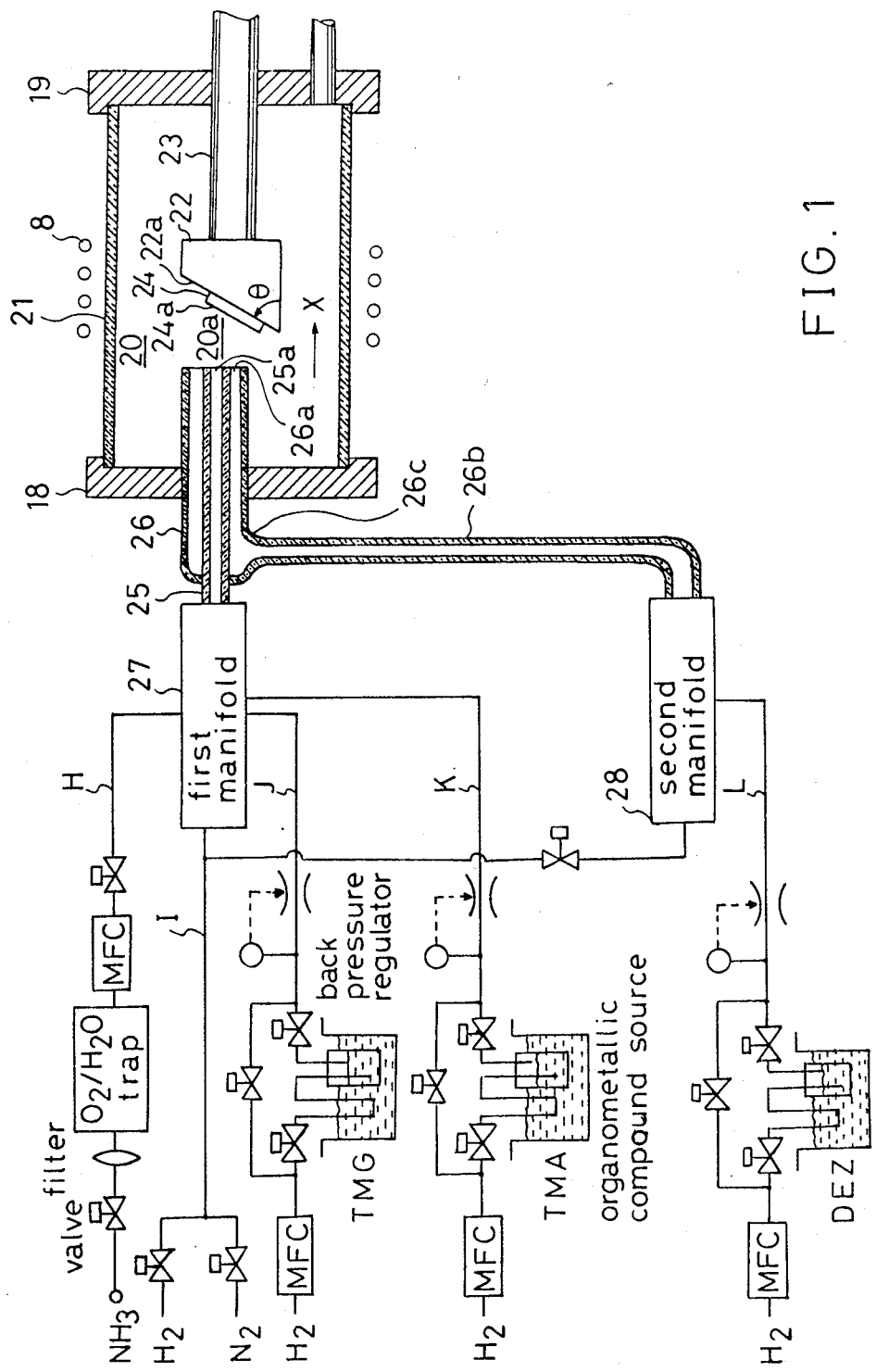
FIG. 1 is a structural view showing a vapor growth apparatus shown in the 1st embodiment.

In FIG. 1 showing a vapor growth apparatus according to the 1st embodiment, a reaction chamber 20 is formed by a space surrounded with a cylindrical quartz reaction tube 21, a front side plate 18 and a rear side plate 19. Into the reaction chamber 20, a control rod 23 supported slidably with the rear side plate 19 is protruded and the susceptor 22 is held by the tip of the control rod 23 for adjustment. Also, on a main surface 22a of the susceptor 22, a sapphire substrate 24 having a main surface 24a which is subjected to the crystal growth is disposed. A high frequency coil 8 for heating the sapphire substrate 24 is arranged around the quartz reaction tube 21.

Meanwhile, on the gas inlet side of the reaction chamber 20, a first reactant gas tube 25 and a second reactant gas tube 26 are provided. The first reactant gas tube 25 is disposed concentrically within the second reactant gas tube 26. The internal space of the first reactant gas tube 25 and that of the second reactant gas tube 26 are completely separated so that reactant gases introduced through the both reactant gas tubes 25, 26 are not mixed therein.

On the external wall of the second reactant gas tube 26, a gas inlet 26c is formed and a feed tube 26b is connected thereto. The first reactant gas tube 25 is connected to a first manifold 27 at one end, and the second reactant gas tube 26 is connected to a second manifold 28 through the feed tube 26b. To the first manifold 27, a supply system H of $NH_3$, a supply system I of a carrier gas, a supply system J of TMG and a supply system K of TMA are connected, and to the second manifold 28, the supply system I of the carrier gas and a supply system L of DEZ are connected.

Since the apparatus is constructed as such, from the opening 25a of the first reactant gas tube 25, a mixed gas of $NH_3$, TMG, TMA and $H_2$ flows out into the reaction chamber 20, and from the opening 26a of the second reactant gas tube 26, a mixed gas of DEZ and $H_2$ flows out into the reaction chamber 20.

When forming an N-type $Al_xGa_{1-x}N$ thin film, the mixed gas may be introduced only from the first reactant gas tube 25, and when forming an I-type $Al_xGa_{1-x}N$ thin film, the mixed gas may be introduced respectively from the first and second reactant gas tubes 25, 26.

When forming the I-type $Al_xGa_{1-x}N$ thin film, DEZ which is the dopant gas is mixed with the reactant gas introduced from the first reactant gas tube 25 only at a reaction chamber 20a in the vicinity of the sapphire substrate 24. Then, DEZ is blown against the sapphire substrate 24 and decomposed thermally, a dopant element is doped to growing $Al_xGa_{1-x}N$ to yield I-type $Al_xGa_{1-x}N$. In this case, since the reactant gas and dopant gas are completely separated by the first and second reactant gas tubes 25, 26 and led to a reaction chamber 20a near the sapphire substrate 24, reaction between DEZ and TMG or TMA within the feed tube of the gas occurred in the prior art apparatus is restrained, so that the doping is conducted satisfactorily.

The opening 25a of the first reactant gas tube 25 and the opening 26a of the second reactant gas tube 26 are adjusted by the control rod 23 so as to be spaced at 10 to 60 mm from the sapphire substrate 24. Also, an inclined angle $\theta$ of the main surface 22a of the susceptor 22 relative to he direction X of the reactant gas flow is set at 45°. In this arrangement, a better crystal was yielded as compared with the case where the susceptor 22 is arranged normally to the gas flow.

By photomicrographs, a rocking curve of X rays and a photoluminescence measurement, it has been confirmed that the crystallinity of the I-type $Al_xGa_{1-x}N$ obtained by the apparatus is superior to that grown in the prior art vapor growth apparatus.

Figure 2:
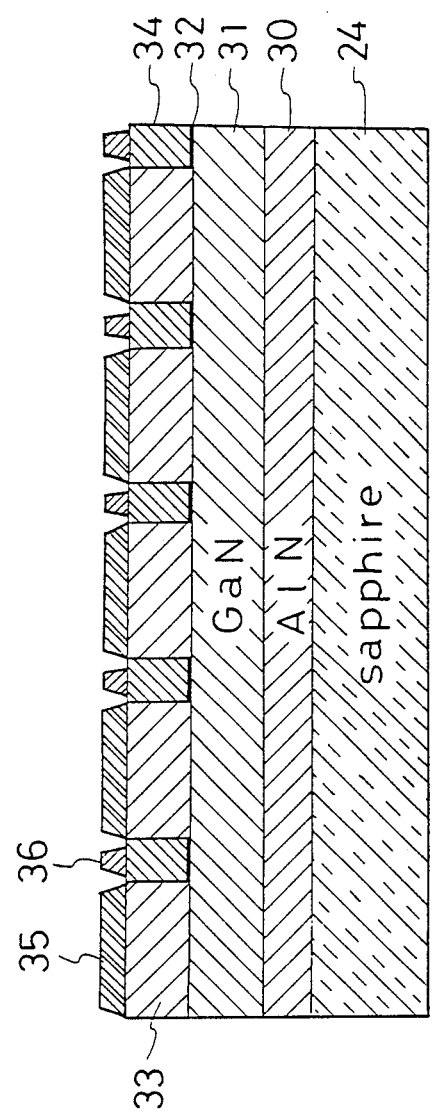
FIG. 2 is a sectional view showing the structure of a light emitting diode produced by utilizing a vapor growth apparatus shown in the 1st to 5th embodiments.

A process of producing a light emitting diode by the crystal growth of GaN on the sapphire substrate will be now described referring to FIGS. 1 and 2.

The single crystal sapphire substrate 24 including the surface c ({0001}) as the main surface, which is cleaned by the organic cleansing and heat treatment, is first disposed on the main surface 22a of the susceptor 22. Then, the sapphire substrate 24 was subjected to the vapor etching at 1100° C. as feeding $H_2$ from the first and second reactant gas tubes 25, 26 into the reaction chamber 20 at a flow rate of 0.3 l/min. Next, the heat treatment was performed for 1 minute as lowering the temperature to 950° C. and supplying $H_2$ at 3 l/min., $NH_3$ at 2 l/min. and TMA at $7 \times 10^{-6}$ mols/min. from the first reactant gas tube 25, thereby a 0.1 μm thick AlN buffer layer 30 was formed. As suspending the supply of TMA after 1 minute and keeping the temperature of the sapphire substrate 24 at 970° C., $H_2$ was supplied at 2.5 l/min., $NH_3$ at 1.5 l/min. and TMG at $1.7 \times 10^{-5}$ mols/min. from the first reactant gas tube 25 for 60 minutes to form an N layer 31 consisting of the N-type GaN thin film of about 7 μm thick.

The sapphire substrate 24 was next taken out from the reaction chamber 20, and the main surface of the N layer 31 coated with a photoregist was etched after being exposed by using a mask of prescribed pattern to form the photoregist of prescribed pattern thereon. Using the photoregist as the mask, an $SiO_2$ film 32 of about 100 Å film thickness was patterned. Thereafter, the photoregist was removed and the sapphire substrate patterned only with the $SiO_2$ film 32 was cleaned, remounted to the susceptor 22 and subjected to the vapor etching.

Then, as keeping the temperature of the sapphire substrate 24 at 970° C. an feeding $H_2$ at 2.5 l/min., $NH_3$ at 1.5 l/min. and TMG at $1.7 \times 10^{-5}$ mols/min. from the first reactant gas tube 25, and DEZ at $5 \times 10^{-6}$ mols/min. from the second reactant gas tube 26 for 5 minutes, an I layer 33 consisting of I-type GaN was grown to the film thickness of 1.0 μm. At this time, at the window portion when the N layer 31 of GaN is exposed, single crystal I-type GaN grows and the I layer 33 is yielded, but on the $SiO_2$ film 32, a conductive layer 34 consisting of polycrystalline GaN is formed. Since the conductive layer 34 is polycrystalline, it has conductivity.

Then the sapphire substrate 24 is taken out from the reaction chamber 20, aluminum electrodes 35, 36 are evaporated on the I layer 33 and conductive layer 34, and the sapphire substrate 24 was cut into a prescribed size to form the light emitting diode. In this case, the electrode 35 acts as the electrode for the I layer 33 and the electrode 36 for the N layer 31 through the conductive layer 34 and the very thin $SiO_2$ film 32. Then, by bringing the I layer 33 at a positive potential with respect to the N layer 31, a junction face between the two layers becomes luminous.

Also, in forming the $Al_xGa_{1-x}N$ group light emitting diode, TMA may be introduced from the first reactant gas tube 25 at a prescribed rate when forming the N layer 31 and the I layer 33. For example, by maintaining the temperature of the sapphire substrate 24 at 1105° C. and supplying $H_2$ at 3 l/min. $NH_3$ at 2 l/min., TMA at $7.2 \times 10^{-6}$ mols/min. and TMG at $1.7 \times 10^{-5}$ mols/min. from the first reactant gas tube 25, and DEZ at $5 \times 10^{-6}$ mols/min. from the second reactant gas tube 26, the I-type $Al_xGa_{1-x}N$ (x=0.3) group semiconductor thin film can be obtained.

In the light emitting diode mentioned above, though the surface c ({0001}) was selected as the main surface of the sapphire substrate, by selecting the surface a ({11$\bar{2}$0}), the light emitting diode of better quality was produced at a lower cost.

In the aforementioned apparatus, though the second reactant gas tube 26 for feeding the dopant gas is disposed concentrically outside the first reactant gas tube 25 for feeding the other main reactant gases, they can be replaced with each other and the first reactant gas tube 25 may be disposed outside the second reactant gas tube 26.

2nd embodiment

Figure 3:
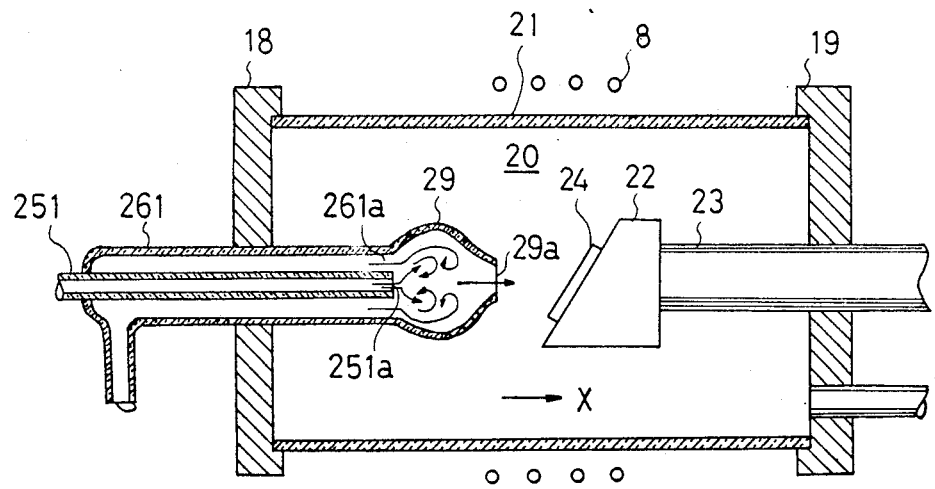
FIG. 3 is a sectional view showing the structure of a vapor growth apparatus shown in the 2nd embodiment.

In a vapor growth apparatus of the 2nd embodiment, the reaction chamber 20 is constructed distinctively as shown in FIG. 3, but the supply systems (not shown) for reactant gases are as same as FIG. 1.

A first reactant gas tue 251 is, as in FIG. 1, disposed concentrically within a second reactant gas tube 261, which is connected to a spherical mixing tube 29, which has a cross-section which gradually widens and gradually narrows along the longitudinal axis of the reaction chamber at its tip. The openings 251a and 261a of the first and second reactant gas tubes 251, 261 are opened toward an internal space of the mixing tube 29. Also, an opening 29a of the mixing tube 29 is opened toward the sapphire substrate 24 disposed on susceptor 22, and the distance therebetween is adjusted to 10 at 60 mm by the control rod 23.

Since the apparatus is constructed as such, from the first reactant gas tube 251, a mixed gas of $NH_3$, TMG and TMA and $H_2$ flows out into the mixing tube 29, and from the second reactant gas tube 261, a mixed gas of DEZ and $H_2$ flows into the mixing tube 29. Then, the reactant gases from the two systems are mixed in the mixing tube 29 before being blown against the sapphire substrate 24 from its opening 29a. At this time, in the mixing tube 29, an eddy flow is produced and the reactant gases from the two systems are mixed sufficiently.

When forming the I-type $Al_xGa_{1-x}N$ thin film, as mentioned above, DEZ which is the dopant gas, is mixed with the reactant gas introduced from the first reactant gas tube 251 only in the mixing tube 29, and after being sufficiently mixed therein it is immediately blown against the sapphire substrate 24 from the opening 29a, so that reaction between DEZ and TMG or TMA within the feed tube of the gas as the prior art apparatus is prevented and the doping is effected satisfactorily.

An inclined angle $\theta$ of the susceptor 22 relative to the direction X of the reactant gas flow is set at 45° as same as the apparatus shown in FIG. 1, thereby a better crystal was obtained.

By photomicrographs, a rocking curve of X rays and a photoluminescence measurement, it has been confirmed that the crystallinity of the I type $Al_xGa_{1-x}N$ obtained by the apparatus was superior to that grown in the prior art vapor growth apparatus.

Figure 4:
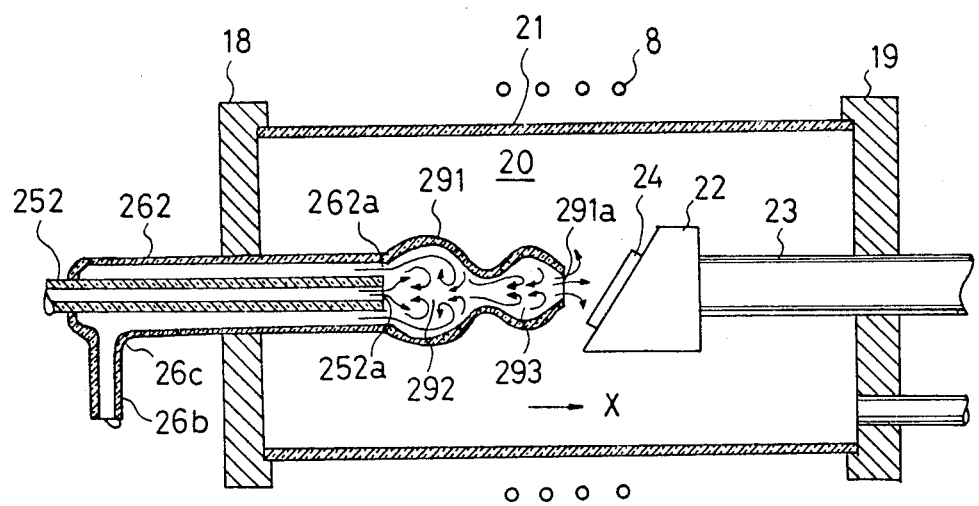
FIG. 4 is a sectional view showing the structure of another vapor growth apparatus shown in the 2nd embodiment.

In the aforementioned embodiment, though the mixing tube 29 is constructed spherically, it will be appreciated that the other shape may be employed. For example, a mixing tube with multiple chambers may be used. As shown in FIG. 4, when a mixing tube 291 connected to the second reactant gas tube 262 is formed to connect a spherical mixing chamber 292 and a spherical mixing chamber 293 in series, mixing of the reactant gases is improved by a double eddy flow, so that the crystallinity of the growing thin film can be improved further.

3rd Embodiment

In the vapor growth apparatus shown in FIG. 1, an inclined angle $\theta$ of the main surface 22a of the susceptor 22 relative to tee direction X of the gas flow was changed to grow the $Al_xGa_{1-x}N$ thin film. When the inclined angle $\theta$ was set in the range of 15° to 75°, the crystallinity of the thin film evaluated by photomicrographs, a rocking curve of X rays and a photoluminescence measurement was superior to that grown at 90°. However, when the inclined angle $\theta$ is set above 75°, the crystallinity is the same as that grown usually at 90°. The inclined angle $\theta$ below 15° is not desirable because the growth rate is low.

In the vapor growth apparatus shown in FIG. 1, the first and second reactant gas tubes 25, 26 are provided and the dopant gas is introduced near to the sapphire substrate 24 without being mixed with the other reactant gases, resulting in a good crystallinity of I-type $Al_xGa_{1-x}N$, but when such a result is not required, by introducing the dopant gas into the reaction chamber after being mixed with the other reactant gases in the manifold in advance as the prior art apparatus, and blowing it against the main surface 24a of the sapphire substrate 24 which is inclined in the range of 15° to 75°, a good crystal growth may be obtained by the effect of inclined sapphire substrate 24.

Also, besides setting the inclined angle $\theta$ of the sapphire substrate 24 in the range of 15° to 75°, as shown in FIGS. 3 and 4, a mixing tube 291 or 292 may be disposed.

Figure 5:
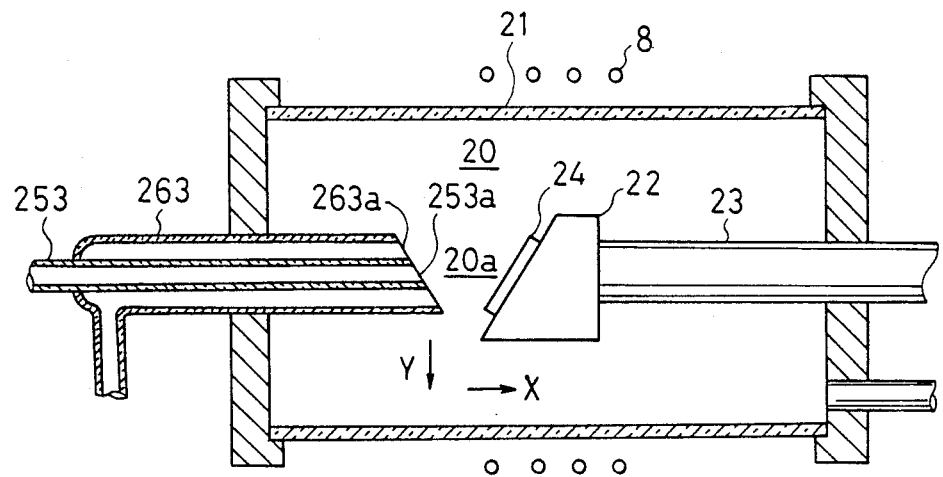
FIG. 5 is a sectional view showing the structure of a vapor growth apparatus shown in the 3rd embodiment.

Furthermore, in the vapor growth apparatus of FIG. 1, though the surface of the openings 25a and 26a of the first and second reactant gas tubes 25, 26 are formed normally to the direction X of the reactant gas flow, as shown in FIG. 5, the surface formed by the openings 25a and 263a of the first and second reactant gas tubes 253, 263 may be inclined to face upward reversely to the perpendicular direction (Y).

4th Embodiment

In FIGS. 6 and 7 showing a vapor growth apparatus according to the 4th embodiment, like functional parts as the apparatus of FIG. 1 are identified by the like reference character. Supply systems of the reactant gases, the first and second reactant gas tubes 25, 26, the susceptor 22, the control rod 23, etc. are as same as the apparatus of FIG. 1.

In FIGS. 6 and 7, in the reaction chamber 20 surrounded by the circular quartz reaction tube 21, the susceptor 22 is supported by the slidable control rod 23 for adjustment. On the main surface 22a of the susceptor 22, the sapphire substrate 24 is disposed. The numeral 8 denotes a high frequency coil for heating the sapphire substrate 24, and the numeral 42 generally indicates a high frequency coil for generating a plasma to being the reactant gas to the state of plasma.

Also, in the reaction chamber 20, a cylindrical auxiliary tube 40 having a semicircular sectional shape is arranged. The auxiliary tube 40 contacts a tube wall 21a of the quartz reaction tube 21 at its bottom 40a and 40b and supported by the tube wall 21a as shown in FIG. 7. The auxiliary tube 40 covers the upper part of the reaction chamber 20 in which the susceptor 22 is disposed. The auxiliary tube 40 may be removed and replaced in the reaction chamber 20 by sliding it along the tube wall 21a of the quartz reaction tube 21 after removing a side plate 41.

Since the apparatus is constructed as such, a mixed gas of $NH_3$, TMG, TMA and $H_2$ is flown out into the reaction chamber 20 from the opening 25a of the first reactant gas tube 25, and a mixed gas of DEZ and $H_2$ from the opening 26a of the second reactant gas tube 26.

The reactant gas to be blown against the sapphire substrate 224 is brought to the state of plasma by the high frequency coil 42 when passing through the first and second reactant gas tubes 25, 26 and in the reaction chamber 20, and blown against the sapphire substrate 24. As this time, the frequency for generating the plasma was 2450 MHz or 13.6 MHz, and temperature of the susceptor 22 was ranged between 400° to 800° C. to develop the $Al_xGa_{1-x}N$ thin film.

As same as the apparatus of FIG. 1, an inclined angle $\theta$ of the susceptor 22 relative to the direction X of the reactant gas flow was set at 45°, thereby a better crystal was yielded.

It is also preferable that the openings 25a, 26a and the sapphire substrate 24 are spaced at 10 to 60 mm by means of the control rod 23 as same as the apparatus of FIG. 1.

In the embodiment mentioned above, the first and second reactant gas tubes 25, 26 are provided, and the dopant gas is introduced near to the sapphire substrate 24 without being mixed with the other reactant gases, resulting in a good crystallinity of the I-type $Al_xGa_{1-x}N$, but when such a result is not required, the dopant gas may be introduced into the reaction chamber of the apparatus of the embodiment after being mixed with the other reaction gases in the manifold in advance as the prior art apparatus, and blown against the main surface 24a of the sapphire substrate 24.

Also, the mixing tubes 29, 291 shown in FIGS. 3 and 4 may be provided, and the openings 25a and 26a of the first and second reactant gas tubes 25, 26 may be formed in an inclined state as shown in FIG. 5.

When the soot is collected on the auxiliary tube 40, which can be taken out by removing the side plate 41 and replaced by the other cleaned tube to begin the next crystal growth immediately.

By photomicrographs, a rocking curve of X rays and a photoluminescence measurement, it has been confirmed that the crystallinity of $Al_xGa_{1-x}N$ obtained by the vapor growth apparatus was superior to that grown in the prior art growth apparatus.

A process of producing a light emitting diode constructed as shown in FIG. 2 by employing the apparats will be now described.

First, the single crystal sapphire substrate 24 including the surface ({0001}) as the main surface, which is cleaned by the organic cleansing and heat treatment, is disposed on the susceptor 22. Pressure in the reaction chamber 20 is then reduced to 5 Torr and the high frequency coil 42 was excited at 13.56 MHZ and 30 W. Thereafter, the sapphire substrate 24 was subjected to the vapor etching at 1100° C. as introducing H$_2$ into the reaction chamber 20 at the flow rate of 0.3 l/min. from the first and second reactant gas tubes 25, 26. Then, the heat treatment was performed for 1 minute as lowering the temperature to 800° C. and supplying H$_2$ at 3 l/min., NH$_3$ at 2 l/min. and TMA at $7\times10^{-6}$ mols/min. from the first reactant gas tube 25, thereby a 0.1 μm thick AlN buffer layer 30 was formed. As suspending the supply of TMA after 1 minute and keeping temperature of the sapphire substrate 24 at 600° C., H$_2$ was supplied at 2.5 l/min., NH$_3$ at 1.5 l/min. and TMG at $1.7\times10^{-5}$ mols/min. from the first reactant gas tube 25 for 60 minutes to form an N layer 31 consisting of the N-type GaN thin film of about 7 μm thick.

Next, the sapphire substrate 24 was taken out from the reaction chamber 20 to form an SiO$_2$ thin film 32 of about 100 Å thick by the photoetching, sputtering and the like.

Thereafter, the sapphire substrate 24 was cleaned and remounted to the susceptor 22, and pressure in the reaction chamber 20 and the high frequency coil 42 were returned to the original state. Then, as same as before, after the vapor etching and as keeping the temperature of the sapphire substrate 24 at 600° C., and supplying H$_2$ at 2.5 l/min., NH$_3$ at 1.5 l/min. and TMG at $1.7\times10^{-5}$ mols/min. from the first reactant gas tube 25, and DEZ at $5\times10^{-6}$ mols/min. from the second reactant gas tube 26 for five minutes, an I layer 33 consisting of I-type GaN was grown to the film thickness of 1.0 μm. At this time, on the portion where GaN is exposed, single crystal I-type GaN is grown to yield the I layer 33, but on the SiO$_2$ film 32, a conductive layer 34 consisting of polycrystalline GaN is formed. Then, the sapphire substrate 24 was taken out from the reaction chamber 20, aluminum electrodes 35, 36 were evaporated onto the I layer 33 and the conductive layer 34, and the sapphire substrate 24 was cut into a prescribed size to form the light emitting diode.

In forming the $Al_xGa_{1-x}N$ group light emitting diode, TMA may be introduced at a prescribed rate from the first reactant gas tube 25 when forming the N layer 31 and I layer 33. For example, by exciting the high frequency coil 42 at 30 W to maintain the temperature of the sapphire substrate 24 at 700° C., and supplying H$_2$ at 3 l/min. NH$_3$ at 2 l/min. TMA at $7.2\times10^{-6}$ mols/min. and TMG at $1.7\times10^{-5}$ mols/min from the first reactant gas tube 25, and DEZ at $5\times10^{-6}$ mols/min. from the second reactant gas tube 26, the I-type $Al_xGa_{1-x}N$ (x=0.3) group semiconductor thin film is obtained.

5th Embodiment

Figure 8:
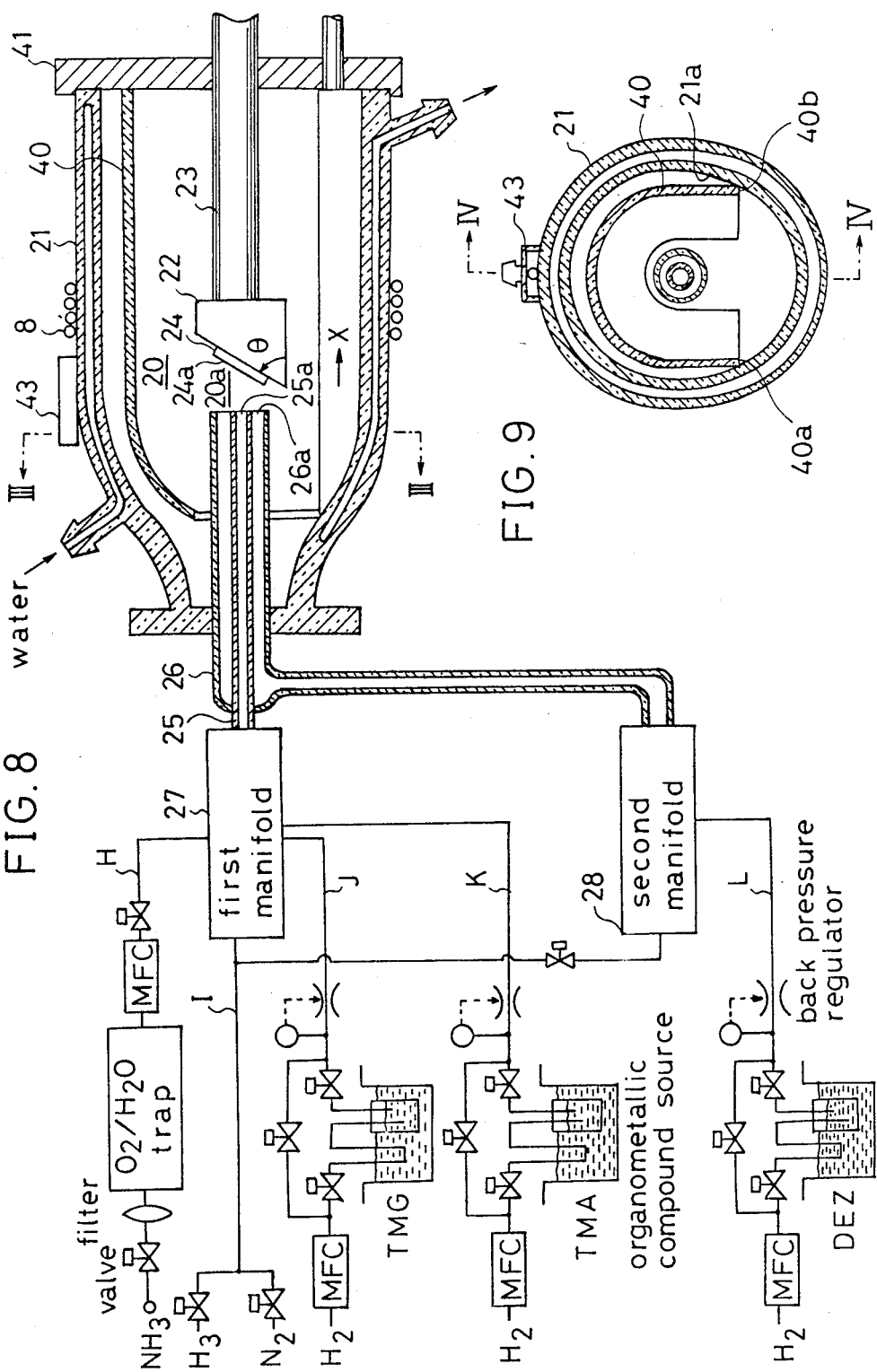
FIG. 8 is a structural view showing a vapor growth apparatus shown in the 5th embodiment.
Figure 9:
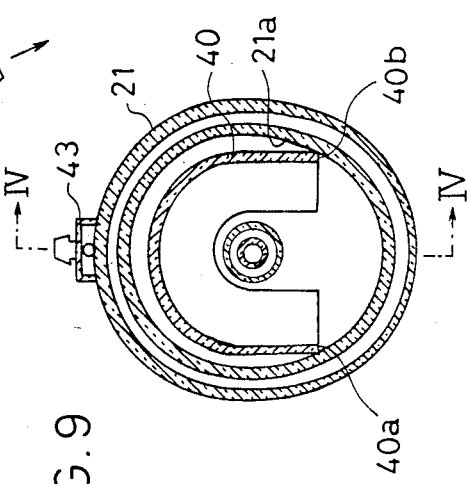
FIG. 9 is sectional view taken in the direction of the arrow along the line III—III of FIG. 8 showing structure of a vapor growth apparatus shown in the 5th embodiment.

A vapor growth apparatus according to the 5th embodiment shown in FIGS. 8 and 9 differs from that of FIG. 6 only in that, a mercury-arc lamp 43 is used in place of the high frequency coil 42 for producing a plasma.

In FIGS. 8 and 9, the mercury-arc lamp 43 has an output of 0.1-8 KW and designed to irradiate ultraviolet rays of 184.9 nm wave length on the main surface 24a of the sapphire substrate 24.

Since the apparatus has been constructed as such, a mixed gas of NH$_3$, TMG, TMA and H$_2$ flows out into the reaction chamber 20 from the opening 25a of the first reactant gas tube 25, and a mixed gas of DEZ and H$_2$ from the opening 26a of the second reactant gas tube 26.

The reactant gas may be controlled in a same manner as the 4th embodiment.

The reactant gas to be blown against the sapphire substrate 24 is irradiated with the ultraviolet rays when blown against the sapphire substrate 24, so that the reaction is accelerated and a good crystallinity is obtained at low temperature of 700° to 800° C.

An inclined angle $\theta$ of the susceptor 22 relative to the direction X of the reactant gas flow is set at 45° as same as the apparatus shown in FIG. 1, thereby a better crystal was obtained.

It is preferable that the openings 25a, 26a and the sapphire substrate 24 are spaced at 10 to 60 mm by the control rod 23 as same as the apparatus of FIG. 1.

In the embodiment mentioned above, the first and second reactant gas tubes are provided and the dopant gas is introduced near to the sapphire substrate 24 without being mixed with the other reactant gases, resulting in a good crystallinity of I-type $Al_xGa_{1-x}N$, but when such a result is not required, the dopant gas may be introduced into the reaction chamber 20 of the apparatus of the embodiment after being mixed with the other reactant gases in the manifold in advance as the prior art apparatus, and blown against the main surface 24a of the sapphire substrate 24.

By photomicrographs, a rocking curve of X rays and a photoluminescence measurement, it has been confirmed that the crystallinity of $Al_xGa_{1-x}N$ obtained by the vapor growth apparatus is superior to that obtained by the prior art apparatus.

A process of producing a light emitting diode constructed as shown in FIG. 2 by employing the apparatus will be now described.

First, the single crystal sapphire substrate 24 including the surface c ($\{0001\}$) as the main surface, which is cleaned by the organic cleansing and heat treatment, is disposed on the susceptor 22. Pressure in the reaction chamber 20 is reduced to 5 Torr and the mercury-arc lamp 43 was energized at 200 W. Thereafter, the sapphire substrate 24 was subjected to the vapor etching at 1100° C. as introducing $H_2$ into the reaction chamber 20 at the flow rate of 0.3 l/min. from the first and second reactant gas tubes 25, 26. Then, the heat treatment was performed for 1 minute as lowering the temperature to 900° C. and supplying $H_2$ at 3 l/min., $NH_3$ at 2 l/min. and TMA at $7 \times 10^{-6}$ mols/min. from the first reactant gas tube 25, thereby a 0.7 μm thick AlN buffer layer 30 was formed. As suspending the supply of TMA after 1 minute and keeping temperature of the sapphire substrate 24 at 700° C., $H_2$ was supplied at 2.5 l/min., $NH_3$ at 1.5 l/min. and TMG at $1.7 \times 10^{-5}$ mols/min from the first reactant gas tube 25 for 60 minutes to form an N layer 31 consisting of the N-type GaN thin film of about 7 μm thick.

Next, the sapphire substrate 24 was taken out from the reaction chamber 20 to form an $SiO_2$ thin film 32 of about 100 Å thick by the photoetching, sputtering and the like. Thereafter, the sapphire substrate 24 was cleaned and remounted to the susceptor 22, pressure in the reaction chamber 20 and the output of the mercury-arc lamp 43 were returned to the original state. Then, as same as before, after the vapor etching and as keeping the temperature of the sapphire substrate 24 at 700° C., and supplying $H_2$ at 2.5 l/min., $NH_3$ at 1.5 l/min. and TMG at $1.7 \times 10^{-5}$ mols/min. from the first reactant gas tube 25 and DEZ at $5 \times 10^{-6}$ mols/min. from the second reactant gas tube 26 for 5 minutes, an I layer consisting of I-type GaN was grown to the film thickness of 1.0 μm. At this time, on the portion where GaN is exposed, single crystal I-type GaN grows and the I layer 33 is yielded, but on the $SiO_2$ film 32, a conductive layer 34 consisting of polycrystalline GaN is formed.

Then, the sapphire substrate 24 was taken out from the reaction chamber 20, aluminum electrodes 35, 36 were evaporated onto the I layer 33 and the conductive layer 34, and the sapphire substrate 24 was cut into a prescribed size to form the light emitting diode.

In forming the $Al_xGa_{1-x}N$ group light emitting diode, TMA may be introduced at a prescribed rate from the first reactant gas tube 25 when forming the N layer 31 and the I layer 33. For example, by energizing the mercury-arc lamp 43 at 200 W to maintain the temperature of the sapphire substrate 24 at 800° C., and supplying $H_2$ at 3 l/min., $NH_3$ at 2 l/min., TMA at $7.2 \times 10^{-6}$ mols/min. and TMG at $1.7 \times 10^{-5}$ mols/min. from the first reactant gas tube 25, and DEZ at $5 \times 10^{-6}$ mols/min. from the second reactant gas tube 26, the I-type $Al_xGa_{1-x}N$ (x=0.3) group semiconductor thin film is obtained.

6th Embodiment

Figure 10:
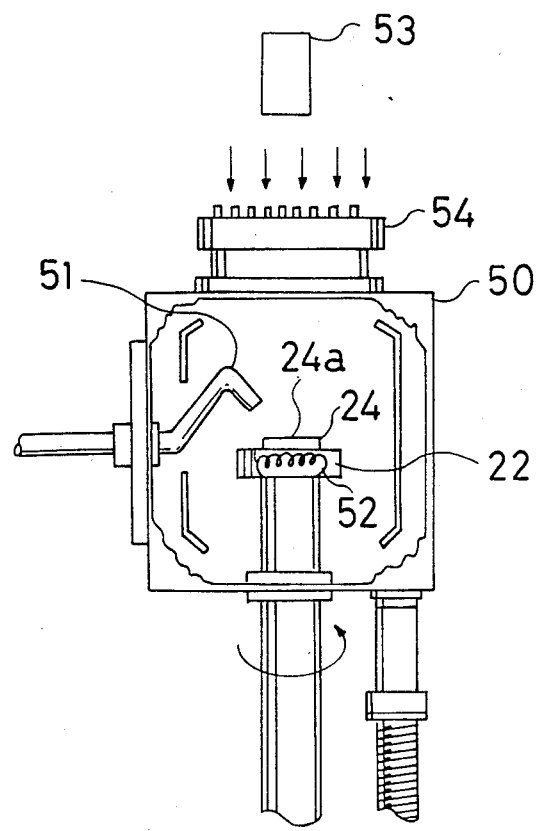
FIG. 10 is a structural view showing a vapor growth apparatus shown in the 6th embodiment

Besides the vapor growth apparatus shown in FIG. 8 and FIG. 9, the vapor growth may be performed also in an apparatus shown in FIG. 10. In the apparatus, the numeral 50 generally denotes a square chamber, in which the susceptor 22 provided with a heater 52 thereunder is disposed. On the susceptor 22, there is also provided the sapphire substrate 24 and a gas feed tube 51 is arranged thereabove. A mixed gas of necessary reactant gases is introduced into the gas feed tube 51. In the upper portion of the chamber 50, a window 54 is opened through which laser beams radiated from an excimer laser oscillator 53 is irradiated vertically onto the main surface 24a of the sapphire substrate 24.

The vapor growth of an $Al_xGa_{1-x}N$ group semiconductor at lower temperature was accelerated by using the excimer laser as the laser beams as such, and a thin film having a high crystallinity was obtained.

What is claimed is:

1. A vapor growth apparatus for compound semiconductors comprising:
   a reaction chamber wherein reactant gases are introduced and vapor growth is performed, said reaction chamber having a first side and a second side,
   a susceptor which is installed in said reaction chamber at said second side and whereon a substrate to be vapor-grown is placed,
   a first reactant gas tube which feeds at least one kind of said reactant gases from said first side of said reaction chamber to said second side, said tube having first and second ends,
   a second reactant gas tube which surrounds said first reactant gas tube forming an annulus and which feeds another kind of said reactant gases to said second side of said reaction chamber, said tube having first and second ends, and
   a mixing tube having first and second ends, said first end of said mixing tube being connected to and in open communication with said second end of said second gas tube and in close proximity to second end of said first gas tube, thereby causing mixing of said reactant gases, said second end of said mixing tube being in close proximity to said susceptor, thereby causing the mixed reactant gases to be blown against the surface of said substrate placed on said susceptor,
   said mixing tube being shaped in a manner such that the cross-section thereof gradually widens at said first end of said chamber in the direction away from said first end toward said second end, and gradually narrows at said second end in a direction away from said first end toward said second end, thereby forming at least one mixing chamber.

2. A vapor growth apparatus in accordance with claim 1, wherein $NH_3$ is introduced through said first reactant gas tube and diethylzinc is introduced through said second reactant gas tube.

3. A vapor growth apparatus in accordance with claim 1, wherein said susceptor is inclined to the longitudinal axis of said reaction chamber within a range of 15°–75°.

4. A vapor growth apparatus in accordance with claim 1, wherein said mixing tube is formed in a nearly spherical shape.

5. A vapor growth apparatus in accordance with claim 1, wherein said second end of said mixing tube is about 10–60 mm distant from said substrate placed on said susceptor.

6. A vapor growth apparatus in accordance with claim 1, wherein said mixing tube is formed in a gourd or guitar shape having two mixing chambers.

* * * * *